(12) United States Patent
Kang et al.

(10) Patent No.: US 6,242,284 B1
(45) Date of Patent: Jun. 5, 2001

(54) METHOD FOR PACKAGING A SEMICONDUCTOR CHIP

(75) Inventors: Kun-A Kang, Seoul; Kyujin Jung, Kyunggi-do; Hyung Jun Park, Kyunggi-do; Jun Hong Lee, Kyunggi-Do, all of (KR)

(73) Assignee: Advanced Semiconductor Engineering, Inc., Taiwan (TW)

( * ) Notice: Subject to any disclaimer, the term of this patent is extended or adjusted under 35 U.S.C. 154(b) by 0 days.

(21) Appl. No.: 09/565,452

(22) Filed: May 5, 2000

(51) Int. Cl.$^7$ ............................ H01L 21/44; H01L 21/48; H01L 21/50

(52) U.S. Cl. ............................ 438/106; 438/126; 438/127

(58) Field of Search .................................. 438/106, 126, 438/127, 672, 673, 669, 692

(56) References Cited

U.S. PATENT DOCUMENTS 5,930,603 * 7/1999 Tsuji et al. .
5,989,935 * 11/1999 Abbott .
6,020,218 * 2/2000 Shim et al. .

* cited by examiner

Primary Examiner—Jey Tsai
Assistant Examiner—Josetta I. Jones
(74) Attorney, Agent, or Firm—Birch, Stewart, Kolasch & Birch, LLP

(57) ABSTRACT

A method for packaging a semiconductor chip, generally comprising the following steps of: (a) forming a plurality of openings on the top surface of the conducting substrate, wherein the upper portions of the openings are formed larger than the lower portions of the openings; (b) forming insulating sections in the conducting substrate by filling an insulating material in the openings; (c) forming a plurality of leads insulated by the insulating sections by planarizing the bottom surface of the conducting substrate to expose and form planarized bottom surfaces of the insulating sections; (d) mounting a semiconductor chip on the bottom surface of the conducting substrate; (e) providing a plurality of conducting wires to electrically connect the semiconductor chip to the leads; and (f) encapsulating the semiconductor chip and the conducting wires. The package according to the present invention is characterized by upper portions of the leads that are purposedly formed larger than lower portions of the leads which prevents the leads from being easily detachable and the package from being destructed by water, the reliability of the package is thus increased.

18 Claims, 5 Drawing Sheets

METHOD FOR PACKAGING A SEMICONDUCTOR CHIP

BACKGROUND OF THE INVENTION

1. Field of the Invention

The present invention relates to a method for packaging a semiconductor chip; more particularly, the present invention relates to a method for packaging a semiconductor that generally forms larger upper portions of the leads relative to lower portions of the leads.

2. Description of the Prior Art

Microelectronic devices are typically comprised of one or more silicon die having, at least in part of, a multitude of die bond pads on a front surface, a chip body, and an interconnection scheme to connect the pads on the die to a supporting substrate and an encapsulating to ensure that the die is protected from contaminants. The combination of these elements is generally referred to as a chip package.

However, the pin count of a package such as DIP (dual inline package) according to a conventional packaging method typically is not high enough. Thus, the latest trend has been emphasized on a BGA (ball grid array) package as shown in FIG. 1, which is developed to address the need for a package of increased pin count such that the dimensions of the package are nearly identical to those of the chip being packaged therein.

Referring to FIG.1, in which a packaged semiconductor chip structure 10 of a prior art is disclosed by the Taiwanes Patent No. 348306 as a preferred embodiment. The packaged semiconductor chip structure 10 includes a chip 11 encapsulated by a molding material 12. Furthermore, a plurality of bonding pads 11a, which are electrically connected to a plurality of leads 13, are formed on the top surface of the chip 11. A conducting adhesive layer 14, which is exposed from the lower portion of the molding material 12, is adhered to the bottom surface of the chip 11 via the top. The leads 13 are exposed on the bottom surface of the molding material 12 and outside the periphery of the chip 11 for electrical connection to external circuits (not shown). Nonetheless, since the exposed leads 13 are not completely encapsulated by the molding material 12, the leads 13 can not be anchored securely by the encapsulation.

Furthermore, since only the top side of the chip 11 is completely sealed by the encapsulation of the molding material 12 and the bottom side thereof exposed, moisture and/or ionic contaminants from the immediate environment may damage the packaged semiconductor chip 10. As a result, the reliablity of the packaged semiconductor chip 10 is diminished as well as the expected life cycle of the chip 11. As the trend for the semiconductor industry is towards packaging IC devices of increasingly smaller size, it is therefore important that an IC package design capable of solving the above problems is devised.

SUMMARY OF THE INVENTION

Accordingly, the object of the present invention is to provide a packaging method that can solve the abovementioned problems.

To achieve the object of the invention, a method for packaging a semiconductor chip on a conducting substrate is provided. The method according to the present invention comprises the following steps of: (a) forming a plurality of openings on the top surface of the conducting substrate, wherein the upper portions of the openings are formed larger than the lower portions of the openings; (b) forming insulating sections in the conducting substrate by filling an insulating material in the openings; (c) forming a plurality of leads insulated by the insulating sections by planarizing the bottom surface of the conducting substrate to expose and form planarized bottom surfaces of the insulating sections; (d) mounting a semiconductor chip on the bottom surface of the conducting substrate; (e) providing a plurality of conducting wires to electrically connect the semiconductor chip to the leads; and (f) encapsulating the semiconductor chip and the conducting wires.

Another method for packaging a semiconductor chip on a conducting substrate that includes a chip region and a lead region, whereas the method comprises the following steps of:(a) forming a plurality of openings on the top surface of the lead region, wherein the upper portions of the openings are larger than the lower portions of the openings; (b) forming insulating sections in the conducting substrate by filling an insulating material in the openings; (c) forming a plurality of leads insulated by the insulating sections in the lead region by planarizing the bottom surface of the conducting substrate to expose and form planarized bottom surfaces of the insulating sections; (d) mounting a semiconductor chip on the chip region of the bottom surface of the conducting substrate; (e) providing a plurality of conducting wires to electrically connect the semiconductor chip to the leads; and (f) encapsulating the semiconductor chip and the conducting wires.

Furthermore, the conducting substrate is turned upside down so that the upper portions of the leads are larger than the lower portions of the leads, which makes the leads less likely to be detached from the substrate and the destruction caused by water less likely to occur, thus the reliability of the package can be increased.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Example 1

FIG. 2A through FIG. 2G schematically depict in cross-sectional views steps involved in a method for packaging a semiconductor chip according to a first example of the present invention.

Figure 1:
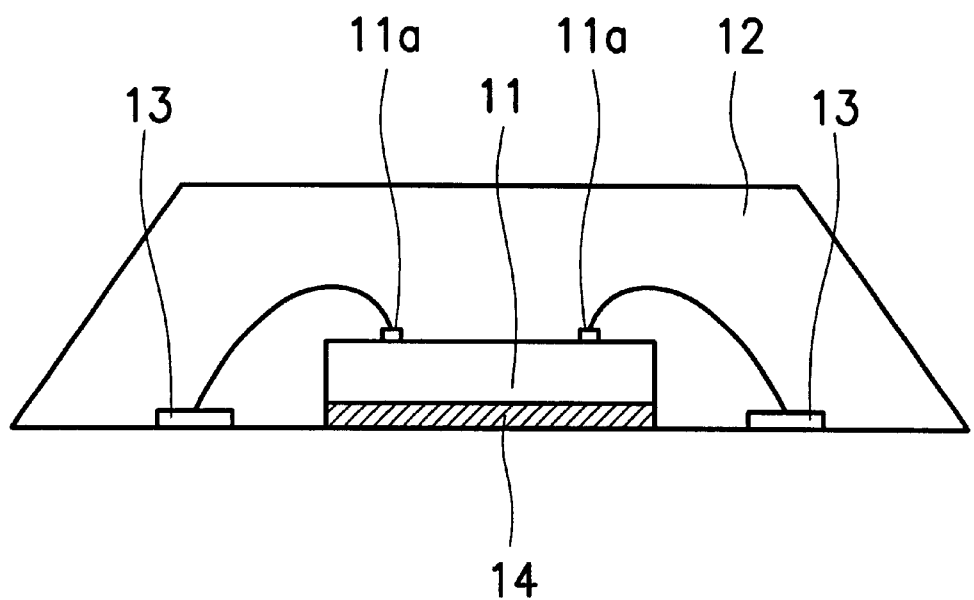
FIG. 1 schematically depicts a conventional BGA package.
Figure 2A:
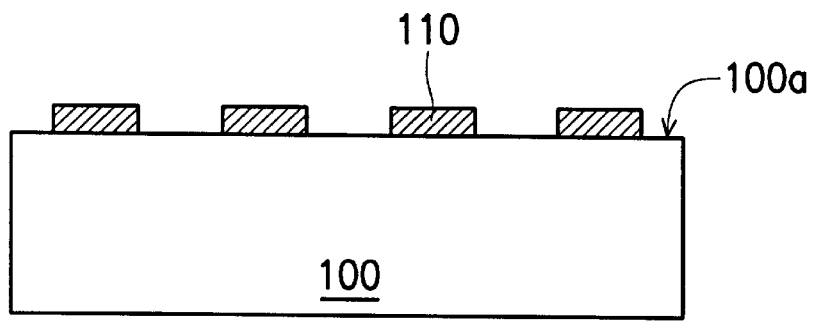
FIG. 2A through FIG. 2G schematically depict in cross-sectional views steps involved in a method for packaging a semiconductor chip according to a first example of the present invention.
Figure 2B:
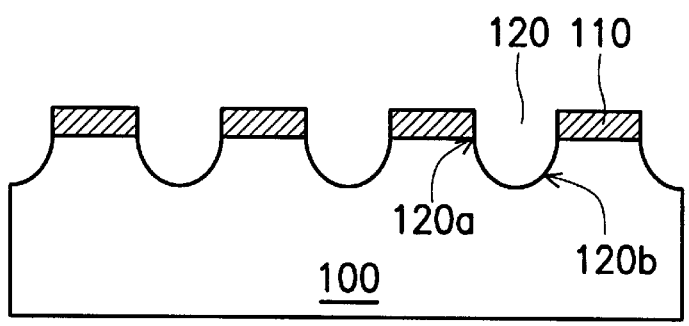
Figure 2C:
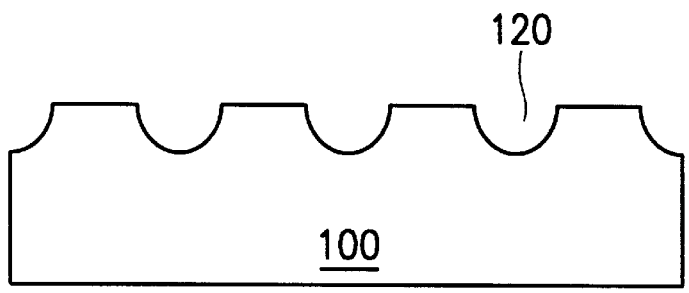

Referring to FIG. 2A through FIG. 2C, which schematically show the steps for forming a plurality of openings in the conducting substrate. For example, referring to FIG. 2A, a conducting substrate 100 made of copper is provided. Then a photoresist layer is coated and patterned on the top surface 100a of the conducting substrate 100. Subsequently, referring to FIG. 2B, the top surface of the conducting substrate 100 is etched by using the patterned photoresist layer 110 as a mask to form a plurality of openings 120. For example, the etching process can be carried out by either a wet etching or a dry etching. It should be noted here that the upper portions 120a of the openings 120 are larger than the lower portions 120b of the openings 120 at this stage such that the openings 120 in cross-sectional views can be either semicircular, reversed trapezoid, or reversed triangular-shaped. Specifically, This embodiment takes a semicircular shape in cross-sectional views of the openings 120 as an example. Thereafter, as shown in FIG. 2C, the patterned photoresist layer 110 is removed.

Figure 2D:
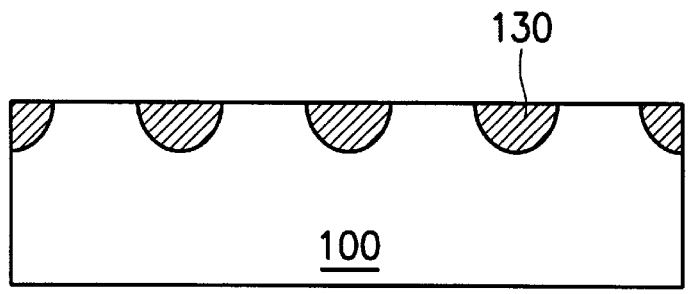

Referring to FIG. 2D, the step of forming insulating sections 130 in the conducting substrate 100 by filling an insulating material in the openings 120 is shown. For example, a molding compound layer such as an epoxy layer is pre-molded on the conducting substrate 100 and filled into the openings 120. The subsequently cooling molding compound layer on the conducting substrate 100 is removed by an etching or grinding process so as to form insulating sections 130 in the conducting substrate 100.

Figure 2E:
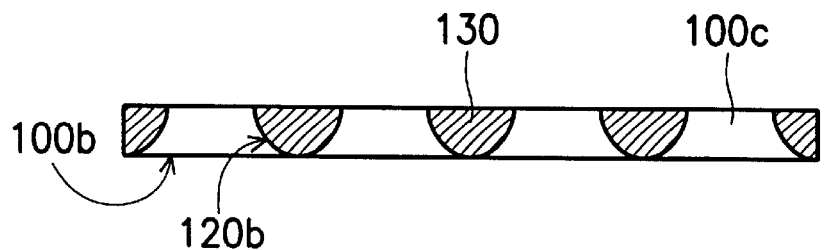

Referring to FIG. 2E, in which a plurality of leads 100c insulated by the insulating sections 130 are formed by planarizing the bottom surface of the conducting substrate 100b to expose and form planarized bottom surfaces of the insulating sections 130. For example, the leads 100c are formed by etching or grinding the conducting substrate 100 to expose the bottoms of the insulating sections 120b.

Figure 2F:
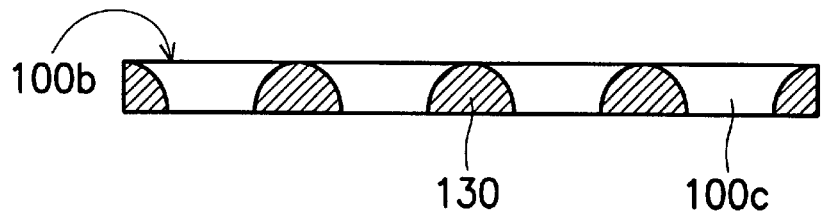

Please refer to FIG. 2F. The conducting substrate 100 is turned upside down so that the upper portions of the leads are larger than the lower portions of the leads. A top view of the conducting substrate 100 of FIG. 2F is shown in FIG. 2H. As the leads 100c are globally formed in the conducting substrate 100, the number of the leads 100c formed can be more than that of the prior art.

Figure 2G:
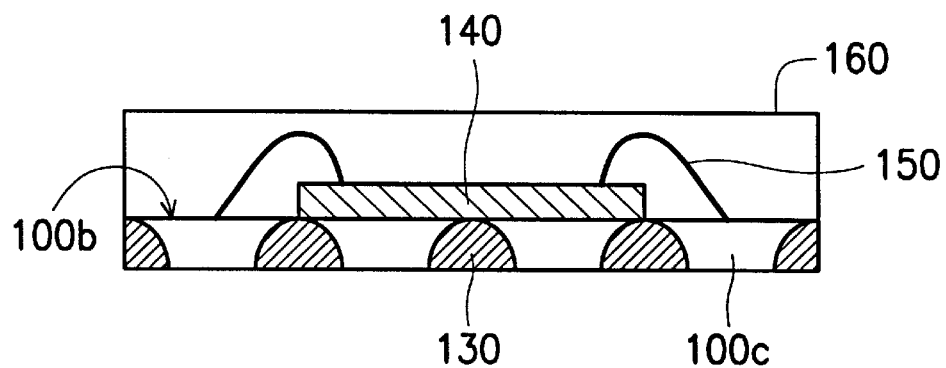
Figure 2H:
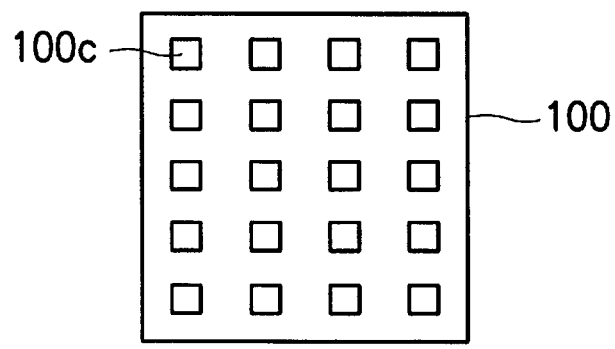
FIG. 2H schematically depicts a top view of the chip shown in FIG. 2F.

Please refer to FIG. 2G. A semiconductor chip 140 is mounted on the surface 100b of the conducting substrate 100. Then a plurality of conducting wires 150 are provided to electrically connect the semiconductor chip 140 to the leads 100c. Thereafter, the semiconductor chip 140 and the conducting wires 150 are completely encapsulated by an upper molding compound layer 160 such as an epoxy layer.

It should be noted here that after the step of encapsulating both the semiconductor chip 140 and the conducting wires 150 by the upper molding compound layer 160 as shown in FIG. 2G, a curing process is required to complete the encapsulated chip package. On the other hand, after the step of pre-molding the insulating sections 130 with a molding compound into the openings 120 as shown in FIG. 2D, the molding compound is cooled at room temperature without proceeding a curing process. As a result of not curing the molding compound of the insulating sections 130 during and after the step of pre-molding the insulating sections 130 such that the chemical binding among the molecules of the molding compound of the insulating sections 130 is not activated until at least after the upper molding compound layer 160 is added thereon, a better binding interface between the upper molding compound layer 160 and the insulating sections 130 can thus be achieved, which saves the cost of a redundant curing process.

Example 2

FIG. 3A through FIG. 3G schematically depict in cross-sectional views steps involved in a method for packaging a semiconductor chip according to a second example of the present invention.

Figure 3A:
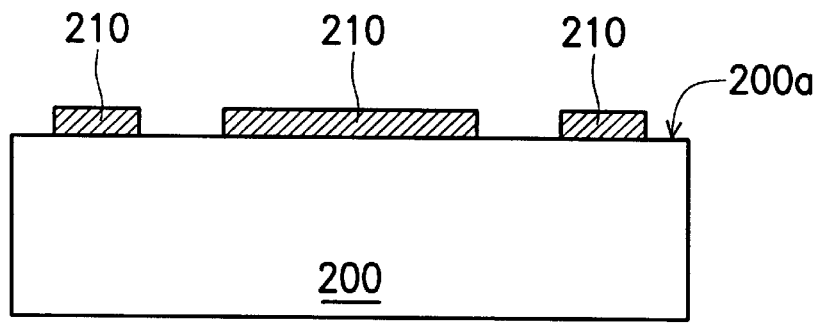
FIG. 3A through FIG. 3G schematically depict in cross-sectional views steps involved in a method for packaging a semiconductor chip according to a second example of the present invention.
Figure 3B:
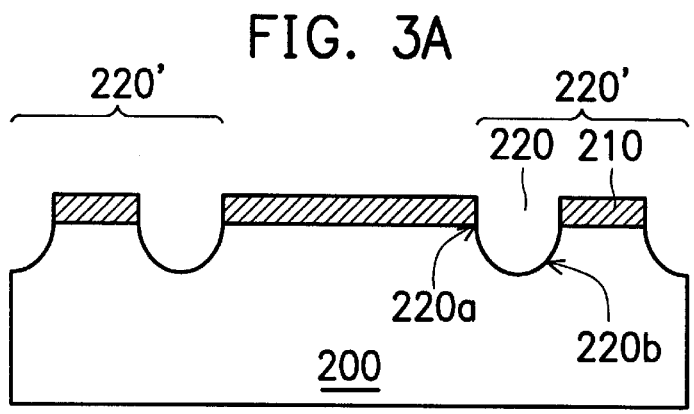
Figure 3C:
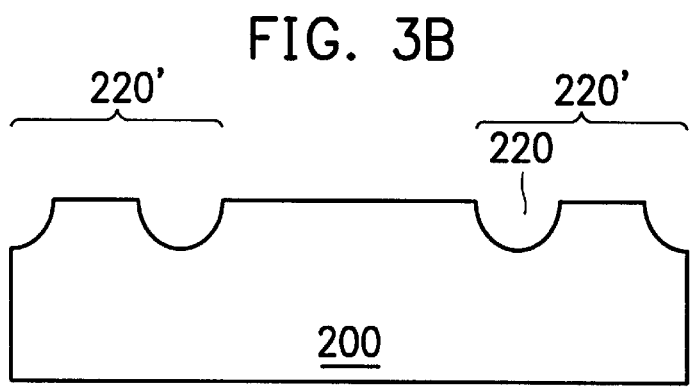

Referring to FIG. 3A through FIG. 3C, whereas steps for forming a plurality of openings in the lead region are shown with the upper portions of the openings formed larger than the lower portions of the openings. For example, referring to FIG. 3A, a conducting substrate 200 made of copper is provided with a lead region and a chip region. Then a photoresist layer 210 is coated and patterned on the top surface 200a of the conducting substrate 200. Subsequently, referring to FIG. 3B, using the patterned photoresist layer 210 as a mask, the top surface of the conducting substrate 200 is then etched to form a plurality of openings 220 in the lead region 220', wherein the etching process can be either a wet etching or dry etching process. It should be noted here that the upper portions 220a of the openings 220 are larger than the lower portions 220b of the openings 220. For example, the openings 220 in cross-sectional views can be either semicircular, reversed trapezoid, or reversed triangular-shaped. Specifically, this embodiment takes a semicircular shape in cross-sectional views of the openings 220 as an example. Thereafter, as shown in FIG. 3C, the patterned photoresist layer 210 is removed.

Figure 3D:
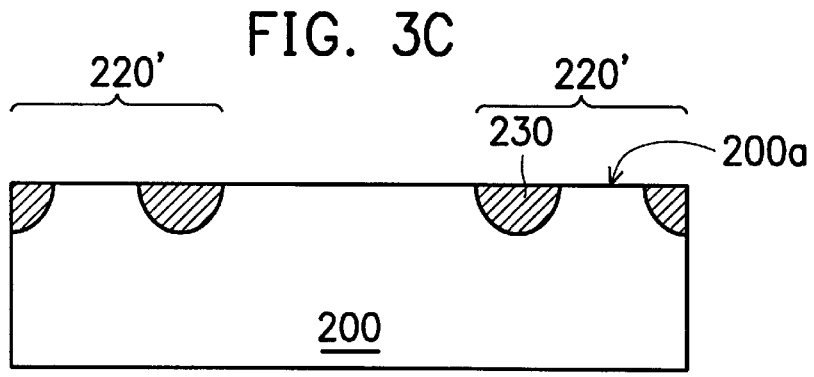

Referring to FIG. 3D, the step of forming insulating sections 230 in the conducting substrate 200 by filling an insulating material in the openings 220 is shown. For example, a molding compound layer such as an epoxy layer (not shown) is pre-molded on the conducting substrate 200 and filled into the openings 220. Subsequently, the cooling molding compound layer on the conducting substrate 200 is removed by an etching or grinding process so as to form insulating sections 230 in the conducting substrate 200.

Figure 3E:
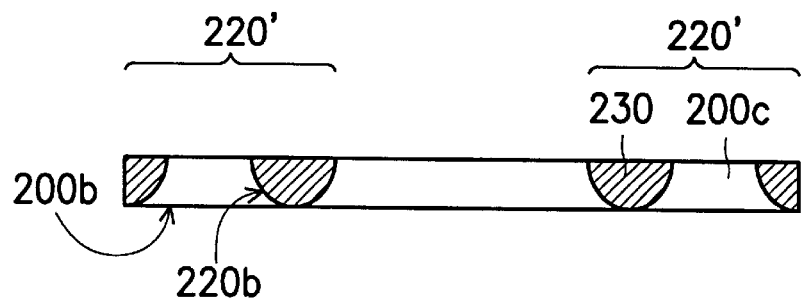

Referring to FIG. 3E, in which a plurality of leads 200c insulated by the insulating sections 230 are formed in the lead region 220' by planarizing the bottom surface of the conducting substrate 200b to expose and form planarized bottom surfaces of the insulating sections 230. For example, the leads 200c are formed by etching or grinding the conducting substrate 200 to expose the bottoms of the insulating sections 220b.

Figure 3F:
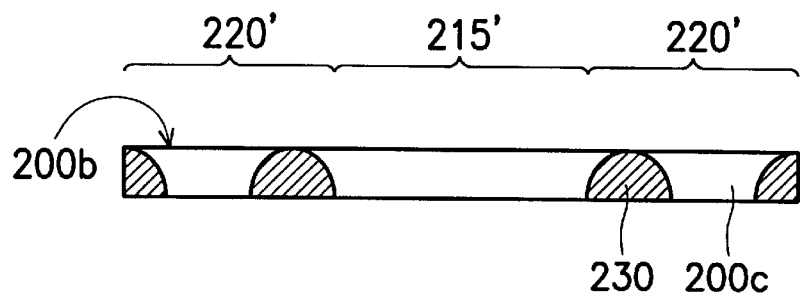

Please refer to FIG. 3F. The conducting substrate 200 is turned upside down so that the upper portions of the leads 200c are larger than the lower portions of the leads 200c. Additionally, the chip region 215' is formed inside the lead region 220'. An top view of the conducting substrate 200 of FIG. 3F is shown in FIG. 3H, wherein the chip region 215' is disposed inside the lead region 220'.

Figure 3G:
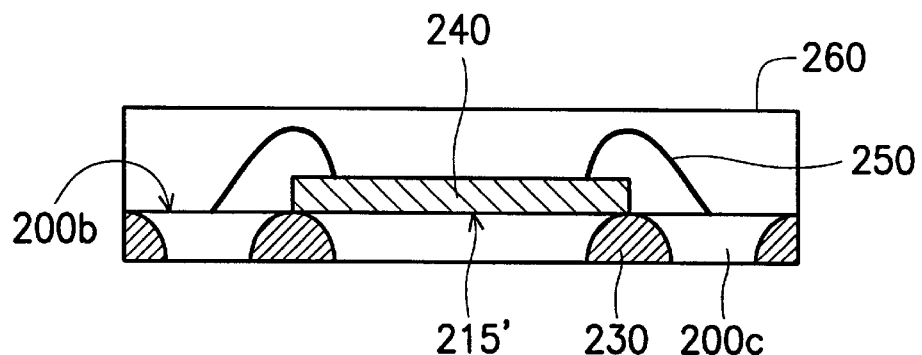
Figure 3H:
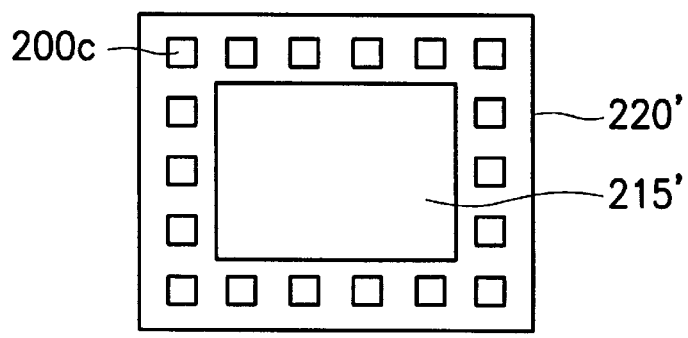
FIG. 3H schematically depicts a top view of the chip shown in FIG. 3F.

Please refer to FIG. 3G. A semiconductor chip 240 is mounted on the chip region 215' of the surface 200b of the conducting substrate 200, wherein a plurality of conducting wires 250 are further provided to electrically connect the semiconductor chip 240 to each of the leads 200c. Thereafter, the semiconductor chip 240 and the conducting wires 250 are completelyl encapsulated by an upper molding compound layer 260 such as an epoxy layer.

It should be noted here that after the step of encapsulating both the semiconductor chip 240 and the conducting wires 250 by the upper molding compound layer 260 as shown in FIG. 3G, a curing process is required to complete the encapsulated chip package. On the other hand, after the step of pre-molding the insulating sections 230 with a molding compound into the openings 220 as shown in FIG. 3D, the molding compound is cooled at room temperature without proceeding a curing process. As a result of not curing the molding compound of the insulating sections 230 during and after the step of pre-molding the insulating sections 230 such that the chemical binding among the molecules of the molding compound of the insulating sections 230 is not activated until at least after the upper molding compound layer 260 is added thereon, a better binding interface between the upper molding compound layer 260 and the insulating sections 230 can thus be achieved, which saves the cost of a redundant curing process.

As the two examples described above, the conducting substrate is turned upside down so that the upper portions of the leads are formed larger than the lower portions of the leads, which prevents the leads from being easily detachable and the package from being destructed by water, the reliability of the IC package is thus increased.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for packaging a semiconductor chip on a conducting substrate, comprising the steps of:
    (a) forming a plurality of openings in the top surface of the conducting substrate, wherein upper portions of the openings are formed larger than lower portions of the openings;
    (b) forming insulating sections in the conducting substrate by filling an insulating material in the openings;
    (c) forming a plurality of leads insulated by the insulating sections by planarizing the bottom surface of the conducting substrate to expose and form planarized bottom surfaces of the insulating sections;
    (d) mounting a semiconductor chip onto the bottom surface of the conducting substrate;
    (e) providing a plurality of conducting wires to electrically connect the semiconductor chip to the leads; and
    (f) encapsulating the semiconductor chip and the conducting wires.

2. The method as claimed in claim 1, wherein the the conducting substrate is comprised of a copper material.

3. The method as claimed in claim 1, wherein the step (a) further comprises the steps of:
    (a1) forming a photoresist layer on the conducting substrate;
    (a2) patterning the photoresist layer on the conducting substrate; and
    (a3) forming a plurality of openings in the conducting substrate by etching the conducting substrate with the patterned photoresist layer being used as a mask, wherein the upper portions of the openings are formed larger than the lower portions of the openings.

4. The method as claimed in claim 3, wherein the etching process is a wet etching process.

5. The method as claimed in claim 3, wherein the etching process is a dry etching process.

6. The method as claimed in claim 1, wherein the step (b) further comprises the steps of:
    pre-molding a molding compound layer on the conducting substrate to fill the openings; and
    removing the cooling molding compound layer on the conducting substrate without performing a curing process.

7. The method as claimed in claim 1, wherein the leads in step (C) are formed by etching or grinding the bottom surface of the conducting substrate to form exposed bottom surfaces of the insulating sections.

8. The method as claimed in claim 1, wherein the upper portions of the leads is formed larger than the lower portions of the leads.

9. A method for packaging a semiconductor chip, comprising the steps of:
    (a) providing a conducting substrate that includes a chip region and a lead region;
    (b) forming a plurality of openings in the top surface of the lead region, wherein upper portions of the openings are larger than lower portions of the openings;
    (c) forming insulating sections in the conducting substrate by filling an insulating material in the openings;
    (d) forming a plurality of leads insulated by the insulating sections in the lead region by planarizing the the bottom surface of the conducting substrate to expose and form planarized bottom surfaces of the insulating sections;
    (e) mounting a semiconductor chip onto the chip region of the bottom surface of the conducting substrate;
    (f) providing a plurality of conducting wires to electrically connect the semiconductor chip to the leads; and
    (g) encapsulating the semiconductor chip and the conducting wires.

10. The method as claimed in claim 9, wherein the conducting substrate is comprised of a copper material.

11. The method as claimed in claim 9, wherein the step (b) further comprises the steps of:
    (b1) forming a photoresist layer on the conducting substrate;
    (b2) patterning the photoresist layer on the conducting substrate; and
    (b3) forming a plurality of openings in the lead region by etching the conducting substrate with the patterned photoresist layer being used as a mask, wherein the upper portions of the openings are formed larger than the lower portions of the openings.

12. The method as claimed in claim 11, wherein the etching process is a wet etching process.

13. The method as claimed in claim 11, wherein the etching process is a dry etching process.

14. The method as claimed in claim 9, wherein the step (c) further comprises the steps of:
    pre-molding a molding compound layer on the conducting substrate to fill the openings; and
    removing the cooling molding compound layer on the conducting substrate without performing a curing process.

15. The method as claimed in claim 9, wherein the leads in step (C) are formed by etching or grinding the bottom surface of the conducting substrate to form exposed bottom surfaces of the insulating sections.

16. The method as claimed in claim 9, wherein upper portions of the leads are formed larger than lower portions of the leads.

17. A method of fabricating a substrate used for a semiconductor chip package, comprising the steps of:
    (a) prividing a conducting substrate;
    (b) forming a plurality of openings in the top surface of the conducting substrate, wherein upper portions of the openings are formed larger than lower portions of the same openings;

(c) forming a plurality of insulating sections in the conducting substrate by filling an insulating material into each of the openings; and (d) forming a plurality of leads insulated by the insulating sections by planarizing the bottom surface of the conducting substrate to expose and form planarized bottom surfaces of the insulating sections.

18. A method of fabricating a substrate used for a semiconductor chip package, comprising the steps of:

(a) providing a conducting substrate that includes a chip region and a lead region;

(b) forming a plurality of openings in the top surface of the lead region, wherein upper portions of the openings are larger than lower portions of the same openings;

(c) forming a plurality of insulating sections in the conducting substrate by filling an insulating material into each of the openings; and (d) forming a plurality of leads insulated by the insulating sections in the lead region by planarizing the the bottom surface of the conducting substrate to expose and form planarized bottom surfaces of the insulating sections.

* * * * *